United States Patent
Tamada et al.

(10) Patent No.: US 6,396,738 B1
(45) Date of Patent: May 28, 2002

(54) NON-VOLATILE SEMICONDUCTOR MEMORY DEVICE CAPABLE OF SUPPRESSING WRITING AND ERASURE FAILURE RATE

(75) Inventors: Satoru Tamada; Tatsuya Saeki, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/805,044

(22) Filed: Mar. 14, 2001

(30) Foreign Application Priority Data

Sep. 28, 2000 (JP) ........................................ 2000-296245

(51) Int. Cl.[7] ............................................... G11C 16/04
(52) U.S. Cl. .................... 365/185.19; 365/185; 365/24; 365/185.22
(58) Field of Search ........................ 365/185.19, 185.22, 365/185.24, 185.03, 185.04, 185.13, 185.12

(56) References Cited

U.S. PATENT DOCUMENTS 5,555,204 A * 9/1996 Enhod et al. .......... 365/189.01
5,784,315 A * 7/1998 Itoh ...................... 365/185.22
6,016,274 A * 1/2000 Itoh ...................... 365/185.29

FOREIGN PATENT DOCUMENTS

| JP | 8-329694 | 12/1996 |
|---|---|---|
| JP | 2000-90675 | 3/2000 |

* cited by examiner

*Primary Examiner*—David Nelms
*Assistant Examiner*—Thong Le
(74) *Attorney, Agent, or Firm*—McDermott, Will & Emery

(57) ABSTRACT

There is provided a non-volatile semiconductor device having a memory cell in which a threshold value voltage changes in accordance with the application of the writing pulse having a predetermined width and voltage with respect to word lines and bit lines and data depending upon the threshold value voltage is written, wherein writing failure is generated in the first time data writing operation, and a writing condition is set for suppressing the writing condition is set which is capable of suppressing the writing failure rate than the case of the first time writing operation when the writing operation is re-executed.

11 Claims, 18 Drawing Sheets

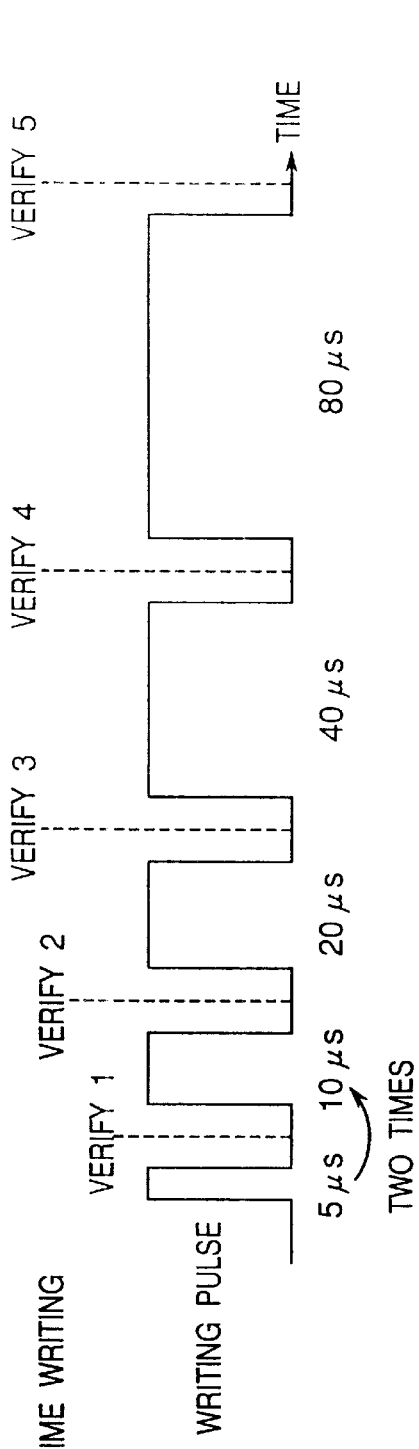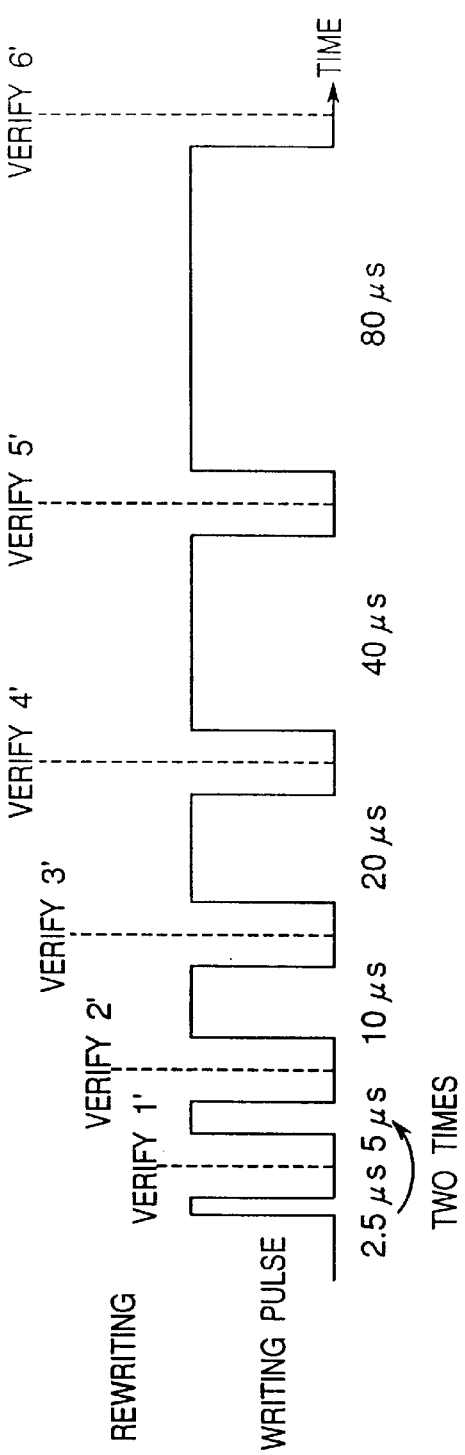
Fig.3A AT THE FIRST TIME WRITING
Fig.3B AT THE TIME OF REWRITING

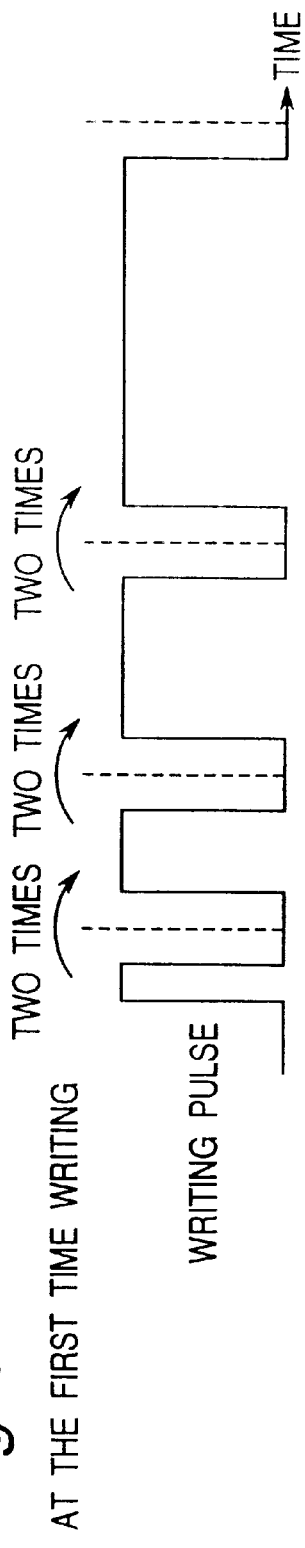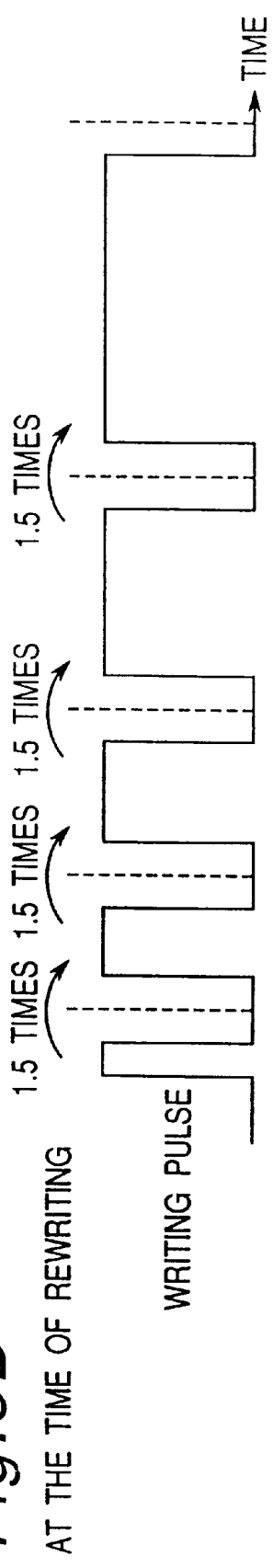
Fig. 5A AT THE FIRST TIME WRITING
Fig. 5B AT THE TIME OF REWRITING

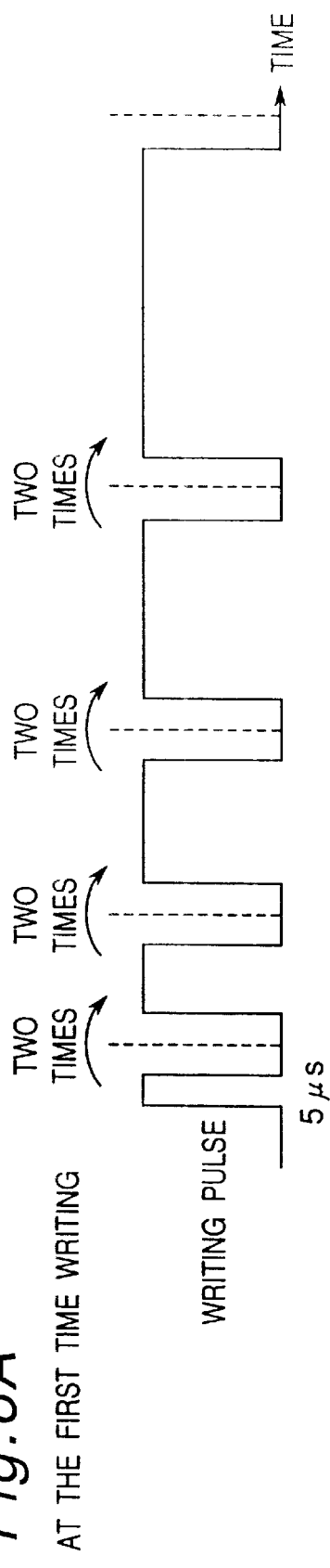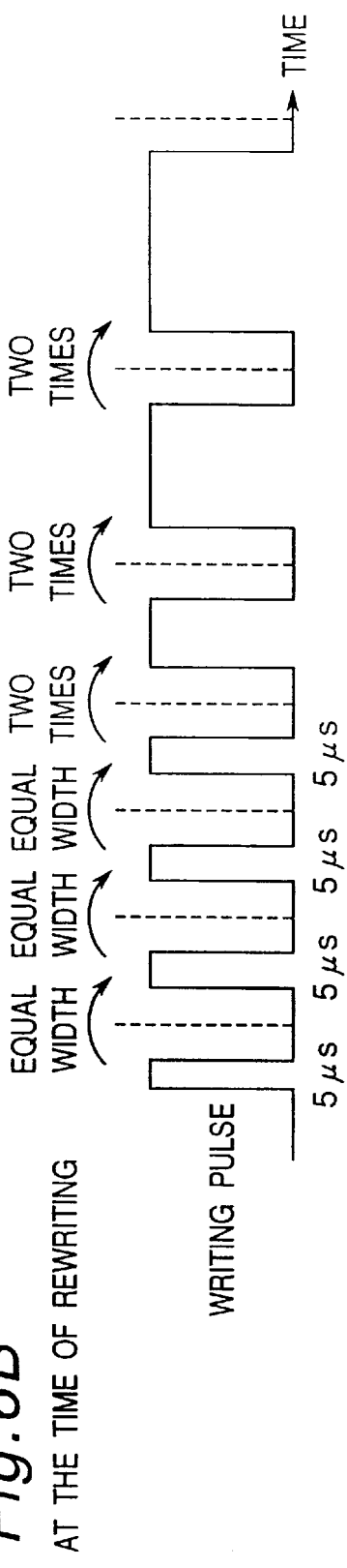
Fig.6A AT THE FIRST TIME WRITING
Fig.6B AT THE TIME OF REWRITING

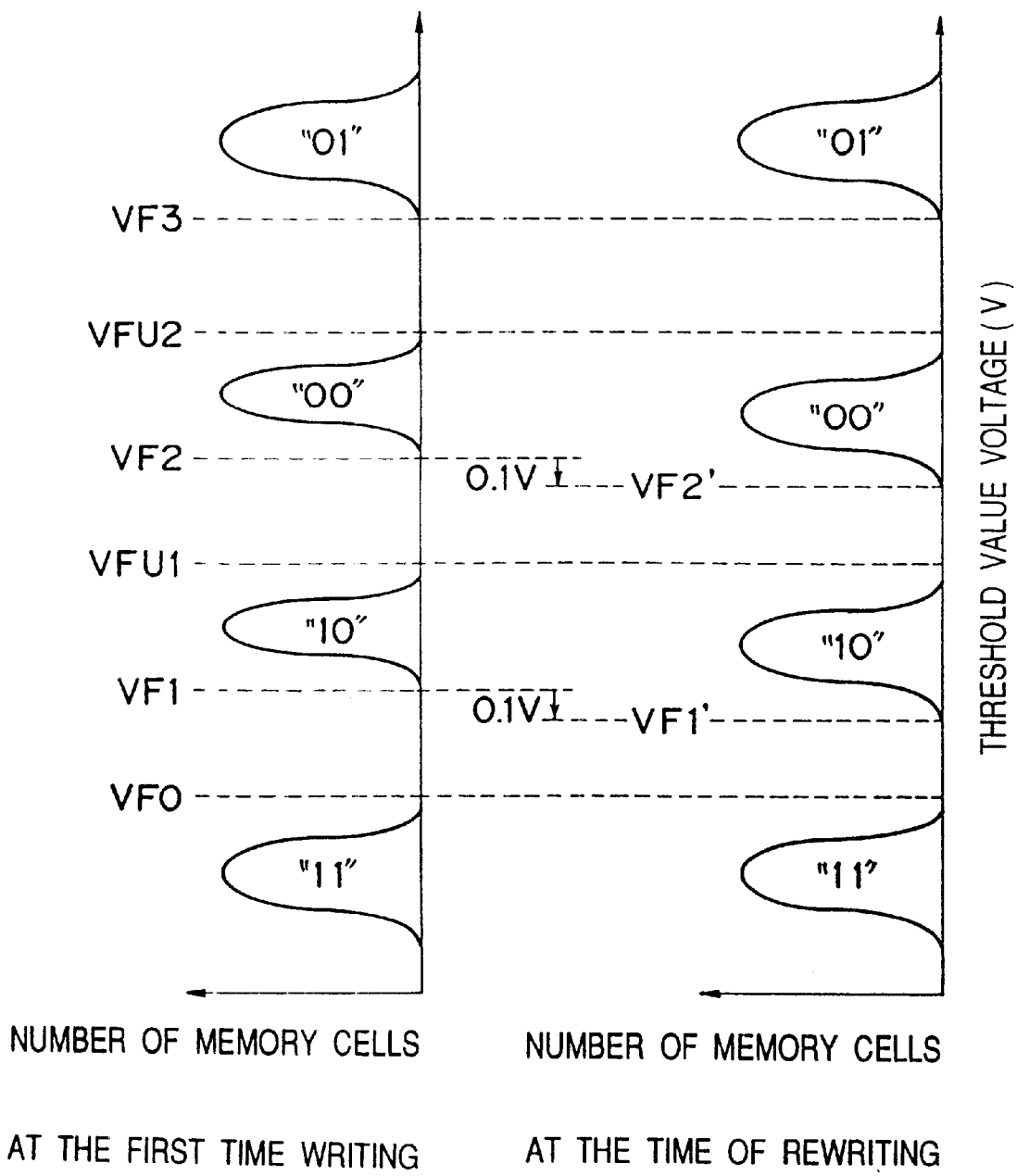

NON-VOLATILE SEMICONDUCTOR MEMORY DEVICE CAPABLE OF SUPPRESSING WRITING AND ERASURE FAILURE RATE

BACKGROUND OF THE INVENTION

The present invention relates to an electrically writable and erasable non-volatile semiconductor memory device such as a flash memory or the like.

In recent years, an electrically writable and erasable non-volatile semiconductor memory device (a so-called flash memory) having a plurality of memory cells provided with a floating gate which is an electric load accumulation layer between a gate and a channel is widely used for a data storage of a digital still camera, a digital audio device and a flash card or the like because the cost thereof is low and the device has an electrically erasing function. In such a flash memory, an increase in the capacity is conventionally demanded together with a high-speed rewriting operation. As one of the technique of attempting an increase in the capacity, a multiple-value technique is known. In a binary value flash memory, a threshold value voltage of the memory cell in slow state is set to "1" (or "0") whereas the threshold value voltage of the memory cell in a high state is set to "0" (or "1"). On the other hand, in the flash memory using the multiple-value technique (hereinafter referred to as a multiple-value flash memory), the flash memory is controlled so that the threshold value voltage of the memory cell is allowed to correspond to the three or more state.

For example, in order to memorize four values, the threshold value voltage of the memory cell is set to four states so that the four states to correspond to "11", "10", "00", and "01", respectively. Here, let "11" correspond to the lowest state of the threshold value voltage, and "01" correspond to the highest state of the threshold value voltage. As a result, it becomes possible to memorize two bits data in one memory cell.

FIGS. 13 and 14 are views showing one example of a threshold value voltage regulated in accordance with each data added to the memory cell of the multiple-value flash memory. In this example, the threshold value in the lowest state corresponding to "11" is regulated to VF0 through VFU0 (for example, 1V through 1.7V), the threshold value voltage in the state corresponding to "10" is regulated to VF1 through VFU1 (for example, 2.3V through 2.7V), the threshold value voltage corresponding to "00" is regulated to VF2 through VFU2 (for example, 3.3 V through 3.7 V) and the threshold value voltage corresponding to "01" is regulated to VF3 or more (for example, 4.3V or more).

In this manner, in the multiple-value flash memory, a plurality of threshold value voltages corresponding to each data are regulated in parallel. In such a case, it is necessary to control the threshold value voltage of the memory cell with good precision as compared with the case in which the conventional binary value flash memory is used.

FIG. 15 shows a procedure of a writing operation in the conventional multiple-value flash memory. When the writing operation starts, the data is input (S51). After the input of the data, a writing pulse (for example, 18V) is applied to the memory cell in which the state of "01" is to be written (S52). Then, the writing verify is conducted at the voltage of VF3 along with the application of this writing pulse (S53). In this writing verify, the data in the memory cell is read by the application of the predetermined verify voltage to, for example, the word line voltage, so that judgment is made as to whether or not the data is normally written by the comparison of this read data with the data to be written. Such a writing pulse application and writing verify are repeated in an interval until judgment is made that the data is normally written. When the verify operation is passed with respect to all the memory cells until the predetermined times are attained (for example, ten times), the process proceeds to the application of the writing pulse of "00" (S54). However, the writing pulse is prevented from being applied to the memory cell which has a threshold value voltage of VF3 or more. On the other hand, in the case where the writing verify is not passed even when the predetermined times are attained, namely, in the case of the presence of the memory cell having the threshold value of not more than VF3, time is over and error end is generated.

At steps S54 & S55, and S56 & S57, the writing pulse application and the writing verify are executed in the same manner as the state of "01" described above with respect to the states of "00" and "01", respectively.

When the application of the writing pulses of "01", "01", and "10" and the writing verify are normally completed at steps S52 through S57, the upper sleeve verify operation in the state of "11", "10" and "01" is subsequently executed (S58 through S60). The upper sleeve verify is an operation of detecting a memory cell whose threshold value voltage becomes too high. When the upper sleeve verify is passed with respect to all the "11", "10" and "00", the writing operation is normally completed. On the other hand, for example, in the case where the threshold value voltage of the memory cell which should be in the state of "00" becomes VFU2 or more, the upper sleeve verify is recognized as "writing failure (hereinafter referred to as a fail)" to judge whether or not the fail is the second time (S61). When the fail is the first time, an erasure is executed (S62). After the threshold value voltage of the memory cell in the sector is brought back to the state of "11", the writing operation same as the first time is executed again from S52.

Next, an erasure operation in the conventional multiple-value flash memory will be explained by referring to FIGS. 16 and 17. FIG. 16 is a view showing a part of a relation between the threshold value voltage and the verify voltage of the memory cell in the erasure state. FIG. 17 is a flowchart showing the above erasure operation. The erasure operation in the multiple-value flash memory is the same as the case of the binary-value flash memory. When the erasure operation starts, an erasure pulse, which is a negative high voltage is applied (S71). Along with the application of the erasure pulse, an erasure verify is executed to judge whether or not the threshold value voltage of the memory cell becomes a predetermined verify voltage (for example, VER which is 1.6V) or less as shown in FIG. 16 (S72). The erasure pulse application and the erasure verify are repeated in an interval until judgment is made that data erasure is normally executed. When the verify operation is passed with respect to all the memory cells until predetermined times are attained (for example, ten times), the process proceeds to the deplete check (S73) On the other hand, in the case where the erasure verify is not passed even if the predetermined times are attained, namely, in the case where the memory cells are present which have the threshold value of VER or less, time is over and error end is generated.

In the deplete check of S73, judgment is made as to whether there is any memory cell whose threshold value voltage has become too low (VF0). When this deplete check is passed, the erasure operation is normally ended. When judgment is made that the deplete check is NG, the write-back pulse of "11" is applied so that the threshold value voltage of the memory cell becomes VF0 or more (S74)

Along with the application of this write-back pulse, the write-back verify is conducted for judging whether or not the threshold value voltage of all the memory cells is VF0 or more (S75). When the write-back verify is passed, the upper sleeve verify of "11" is subsequently executed (S76), so that the memory cell which has the threshold voltage of VF0 or more is detected. In the case where judgment is made that the upper sleeve verify of "11" is OK, the operation is normally ended. On the other hand, in the case where judgment is made that upper sleeve verify is a fail, judgment is made as to whether the fail is the second time or not (S77). In the case where the fail is the first time, the erasure operation same as the first time is conducted from S71 again.

By the way, in order to control the threshold value voltage of the memory cell to a predetermined scope in the writing operation, it is necessary to repeat a relatively short time writing pulse application and the writing verify. Normally, in accordance with this, as shown in FIG. 18, the writing is executed in a relatively short pulse, and gradually longer writing pulse is applied with the result that the threshold value voltage can be controlled in a good precision, and the total writing time can be shortened. However, for all that, there sometimes arises a case in which the threshold value voltage of the memory cell cannot be controlled within the predetermined scope because of the irregular behavior. For example, in FIG. 14, in the case where the threshold value voltage becomes VFU2 or more with respect to the threshold value voltage of only one memory cell which is written in the state of "00", the fail is generated in the upper sleeve verify of "00" so that rewriting is executed after the sector erasure has been executed. When the rewriting is executed, the memory is passed in most cases, and the fail is rarely generated again. In this case, error end is generated.

In order to suppress writing failure, there is considered a method for further shortening the time of one time writing pulse application and setting to a low level the threshold value voltage of the memory cell so that a variation in the threshold value voltage of the memory cell by the one time writing pulse application is reduced. However, in the case where such a method is used, it takes a long time until the writing operation is normally completed. Such a problem can be applied to the case of write-back pulse application of "11" at the time of the erasure operation.

The present invention has been made in view of the above technical problems, and an object of the invention is to provide a non-volatile semiconductor memory device which is capable of shortening the average time until the writing and erasure operation is normally completed and suppressing the failure rate of the writing and erasure operation.

SUMMARY OF THE INVENTION

According to a first aspect of the present invention, there is provided a non-volatile semiconductor device having a memory cell in which a threshold value voltage changes and the data corresponding to the threshold value voltage are written in response to application of the writing pulse having a predetermined width and voltage to word lines and bit lines, the device executing a verify operation for judging the data from the threshold value voltage every application of the writing pulse in the data writing operation, characterized in that: the writing condition is set which is capable of suppressing the writing failure rate than in the case of the first-time writing operation, when the writing failure is generated in the first-time writing operation and the writing operation is re-executed. Furthermore, the initial value of the writing pulse width may be set to a level smaller than the value at the first-time writing operation when the writing operation is re-executed. Furthermore, an increase rate of the writing pulse width may be set to a smaller level than the first-time writing operation when the writing operation is re-executed.

Still furthermore, the writing pulse width may be set to an equal width with respect to a predetermined number of writing pulses after the start of the writing pulse application when the writing operation is re-executed. Furthermore, the writing pulse voltage may be set to a smaller level than the first-time writing operation when the writing operation is re-executed.

Still furthermore, the reference scope of the threshold value voltage used at the above verify time may be set to a larger level than the first-time writing operation when the writing operation is re-executed. Furthermore, the voltage level forming the upper limit of the reference scope of the threshold value voltage may be set to a level higher than the first-time writing operation. Still furthermore, the voltage level forming the lower limit of the reference scope of the threshold value voltage may be set to a level lower than the first-time writing operation.

Still furthermore, the corresponding relation between the data to be written and the threshold value voltage of the memory cell may be changed when the writing operation is re-executed. Furthermore, the corresponding relation between the memory cell in which data is written and the Y address of the data may be changed when the writing operation is re-executed.

The non-volatile semiconductor memory device may be further constituted in such a manner that the device applies a write-back pulse having a predetermined width and a voltage to set the threshold value voltage to a predetermined value or more in the case where the threshold value voltage of the memory cell becomes less than the predetermined value in the data erasure operation, and executes verify operation for judging data from the threshold value voltage every application of the writing pulse with the result that a write-back condition is set which is capable of suppressing the write-back failure rate than the first-time erasure operation in the same manner as the writing condition is capable of suppressing the writing failure than the first-time writing operation, when the write-back failure is generated in the first-time data erasure operation and the erasure operation is re-executed.

BRIEF DESCRIPTION OF THE DRAWINGS

FIGS. 3A and 3B are views showing a writing pulse width set with respect to the writing operation of the multiple-value flash memory;

FIGS. 5A and 5B are views showing a first variation of the writing pulse width set with respect to the multiple-value flash memory;

FIGS. 6A and 6B are views showing a second variation of a writing pulse width set with respect to the multiple-value flash memory;

FIGS. 9A and 9B are views showing a threshold value voltage of a memory cell set with respect to the first-time writing operation and the rewriting operation according to a variation of the third embodiment;

DESCRIPTION OF THE PREFERRED EMBODIMENTS

Embodiments of the present invention will be explained by referring to the attached drawings.

First Embodiment

Figure 1:
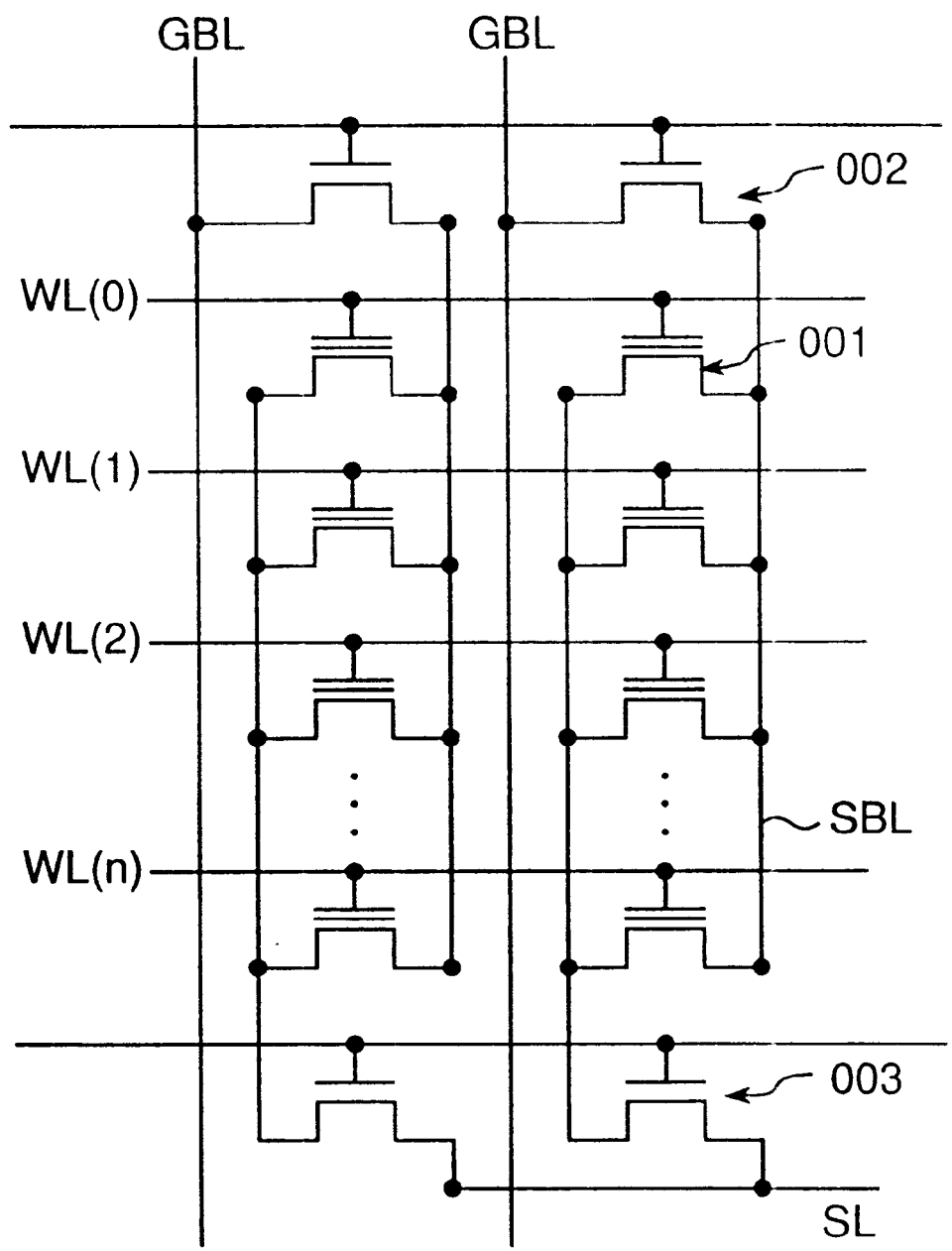
FIG. 1 is a portion of a circuit diagram of a memory cell included in a multiple-value flash memory according to a first embodiment of the present invention.

FIG. 1 is a view showing a part of a circuit diagram of a plurality of memory cell array included in an AND type multiple-value flash memory used for the data storage. This multiple-value flash memory has a memory cell in which a threshold value voltage changes in accordance with the application voltage to the word lines and bit lines, and a value corresponding to the threshold value voltage is stored, and executes a plurality of verify operation (twice in this embodiment) for judging an operation for writing the data in the memory cell and written data from the range of its threshold value voltage. Each of the memory cells (001) comprises one transistor, and each of the memory cells has a gate, a drain and a source. The gate is connected to the word lines (WL) and the drain is connected to global bit lines (GBL) via sub bit lines (SBL), and a selection transistor (002) and the source is connected to source lines (SL) via the selection transistor (003). The writing operation and the erasure operation in the memory cell are normally executed in one word line unit (hereinafter referred to as one sector unit). The writing operation is executed by applying a positive high voltage (for example, 18V) to word lines (WL) to raise the threshold value voltage of the memory cell. However, the threshold value voltage is prevented from being raised by applying an positive writing inhibiting voltage (for example, 6V) to the drain with respect to the memory cell in which data is not desired to be written. In the data erasure operation, a negative high voltage (for example, -17V) is applied to the word lines to lower the threshold value voltage of the memory cell.

Each of the writing operation and the erasure operation is automatically executed with a control circuit (not shown) inside of the memory cell. In the automatic writing operation, writing pulse application and a writing verify for judging whether or not the memory cell is set to the threshold value voltage in the desired scope are repeated for one sector unit and ended when the threshold value voltage in all the memory cells are set within a desired scope. Then, the outside system is notified that the writing operation is completed.

Figure 2:
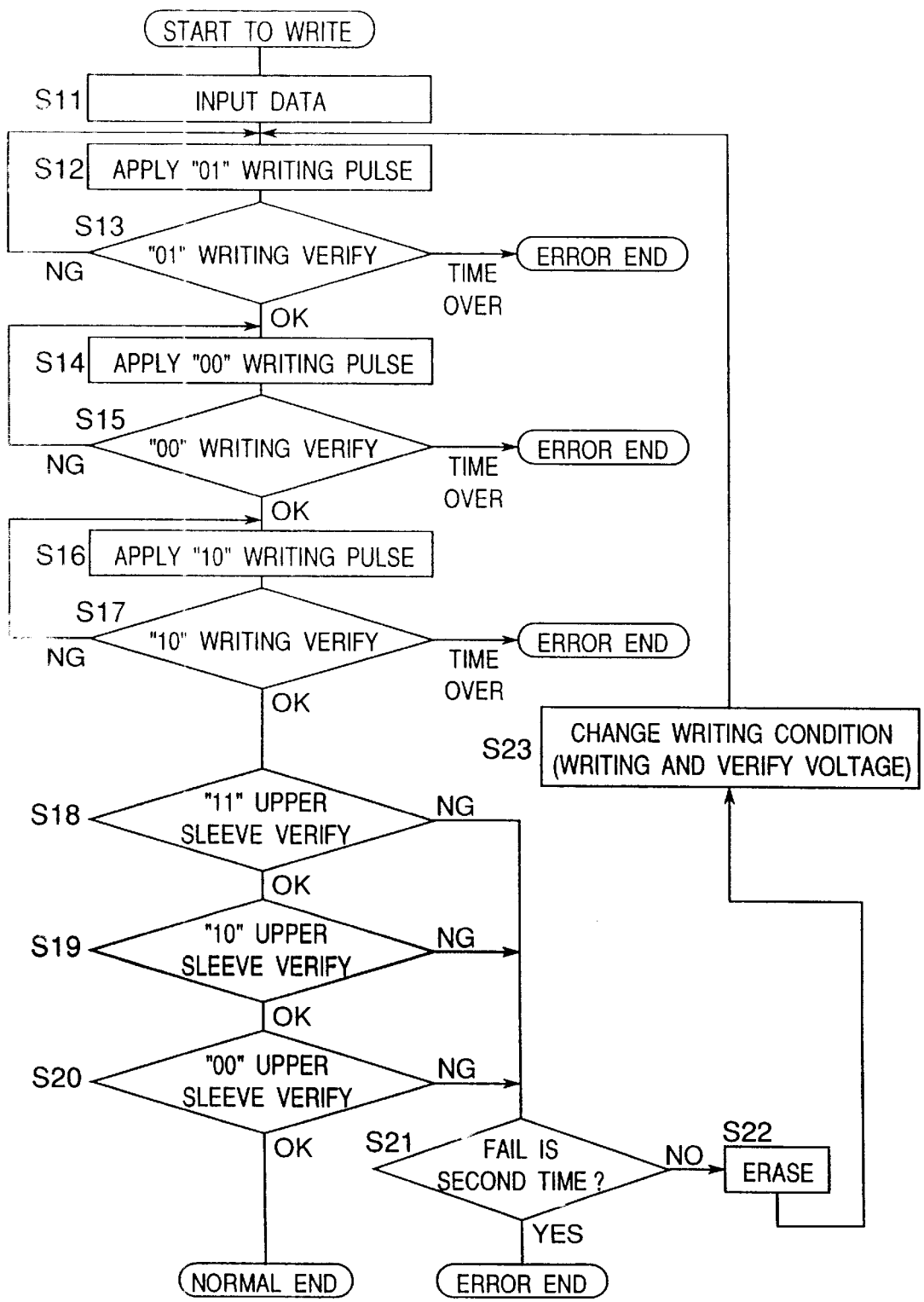
FIG. 2 is a flowchart with respect to a writing operation of the multiple-value flash memory according to the first embodiment.
Figure 13:
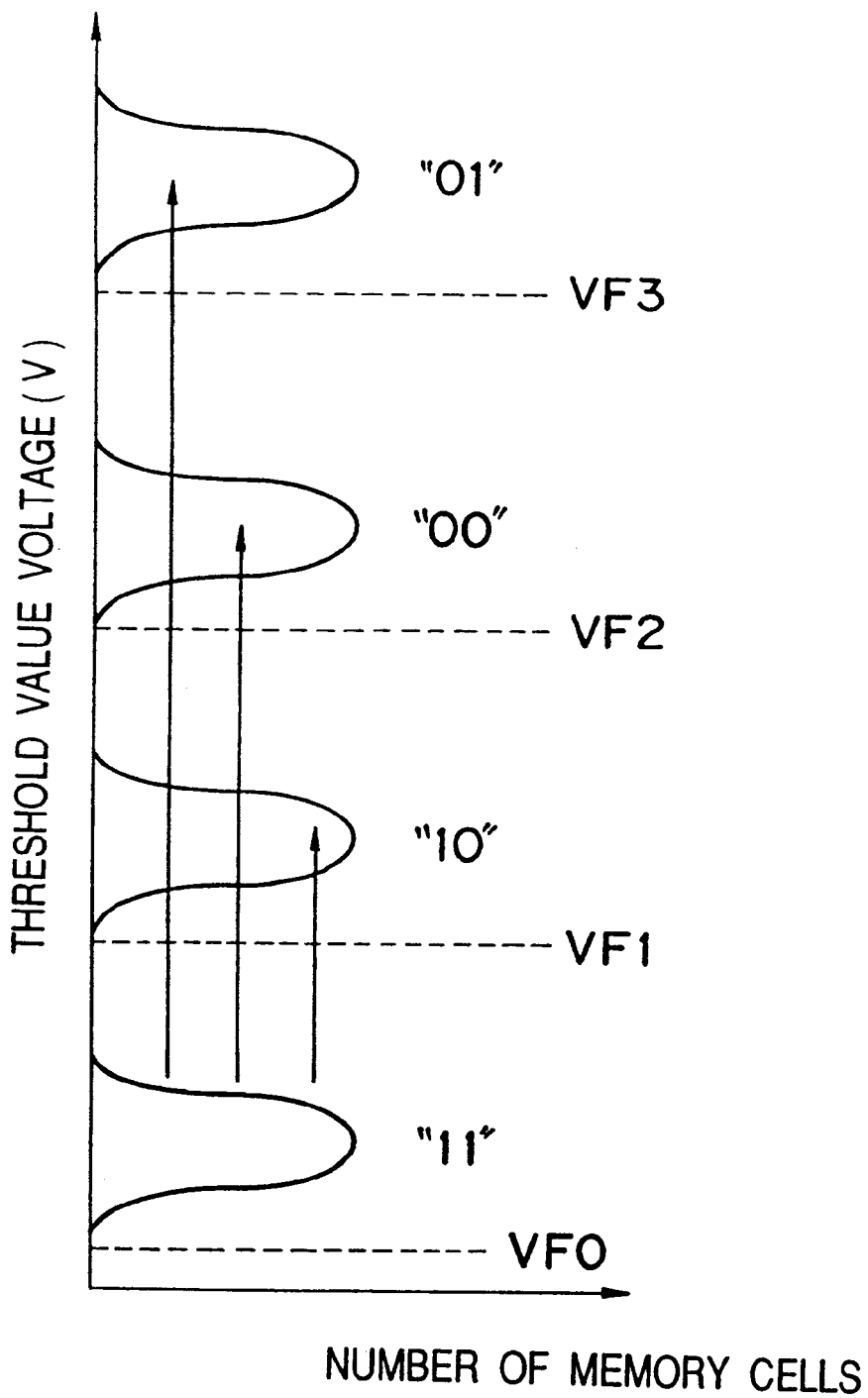
FIG. 13 is a view showing an example of the threshold value voltage (a writing verify voltage) which is regulated in accordance with each data added to the memory cell of the multiple-value flash memory.
Figure 14:
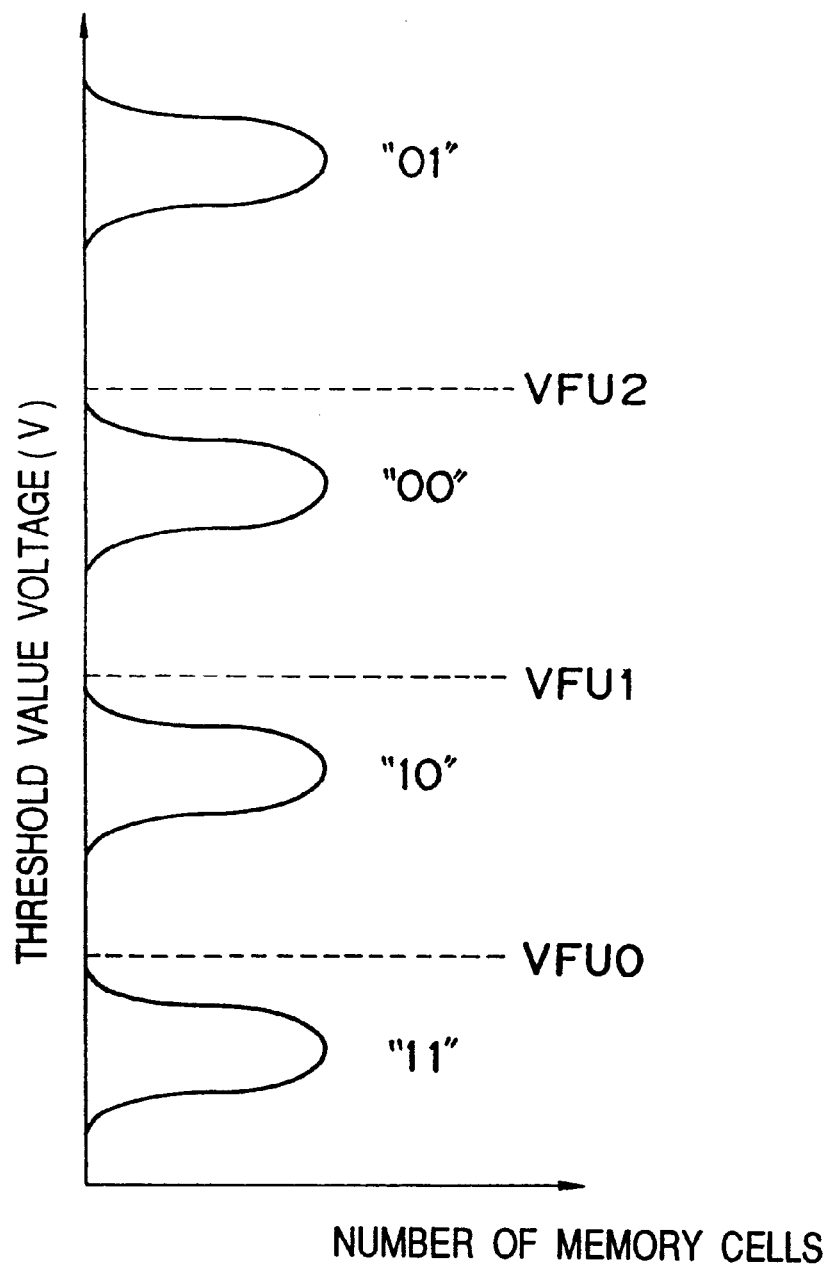
FIG. 14 is a view showing one example of a threshold value voltage (an upper sleeve verify voltage) regulated in accordance with each data added to the memory cell of the multiple-value flash memory.
Figure 15:
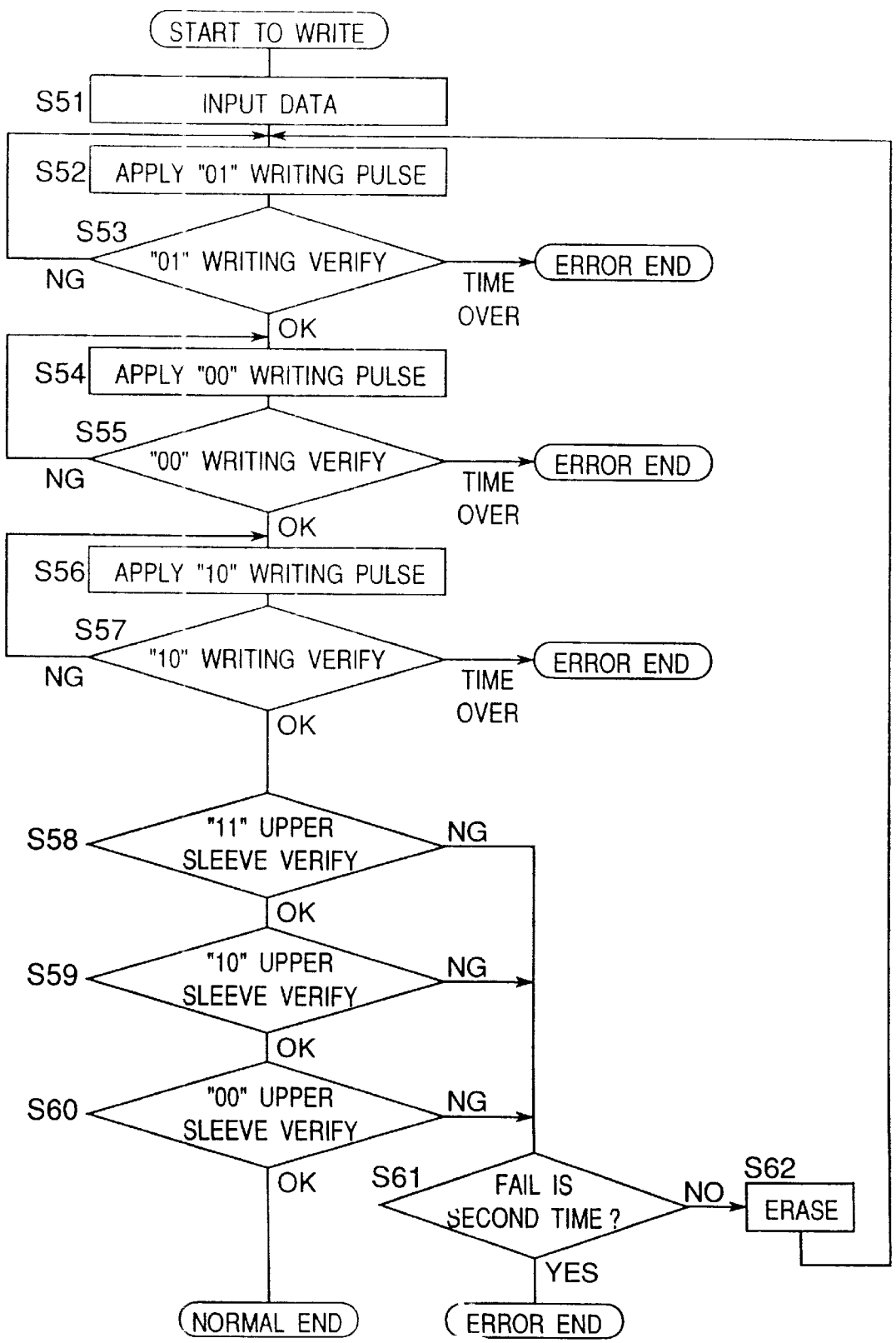
FIG. 15 is a flowchart with respect to the writing operation in the conventional multiple-value flash memory.
Figure 16:
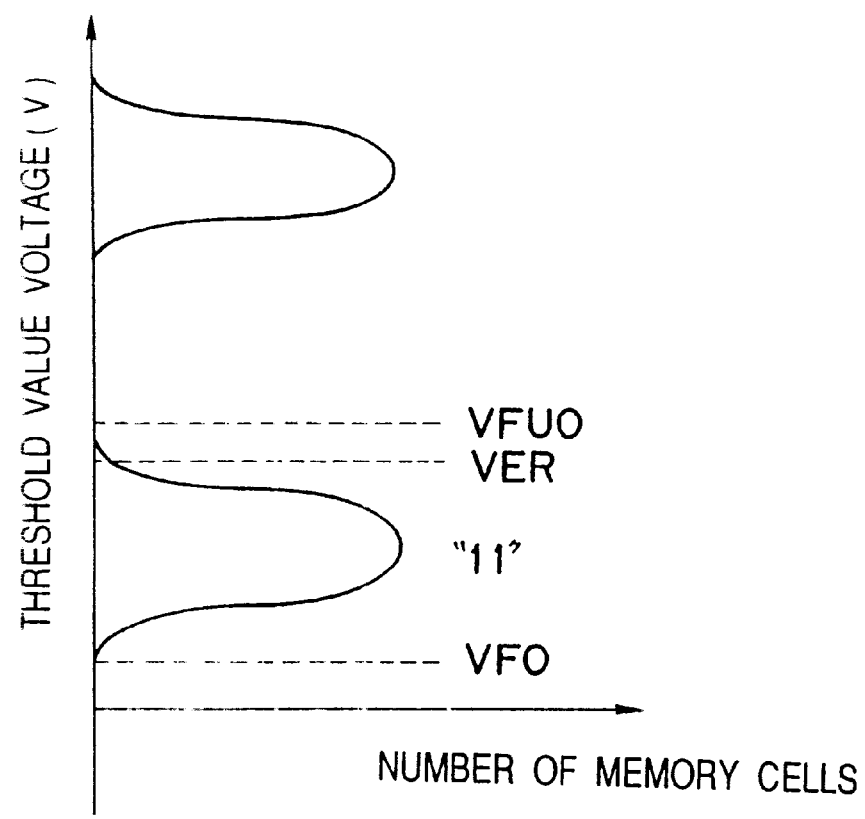
FIG. 16 is a view showing a part of the relation between the memory cell in the erasure state and the verify voltage in the conventional multiple-value flash memory.
Figure 17:
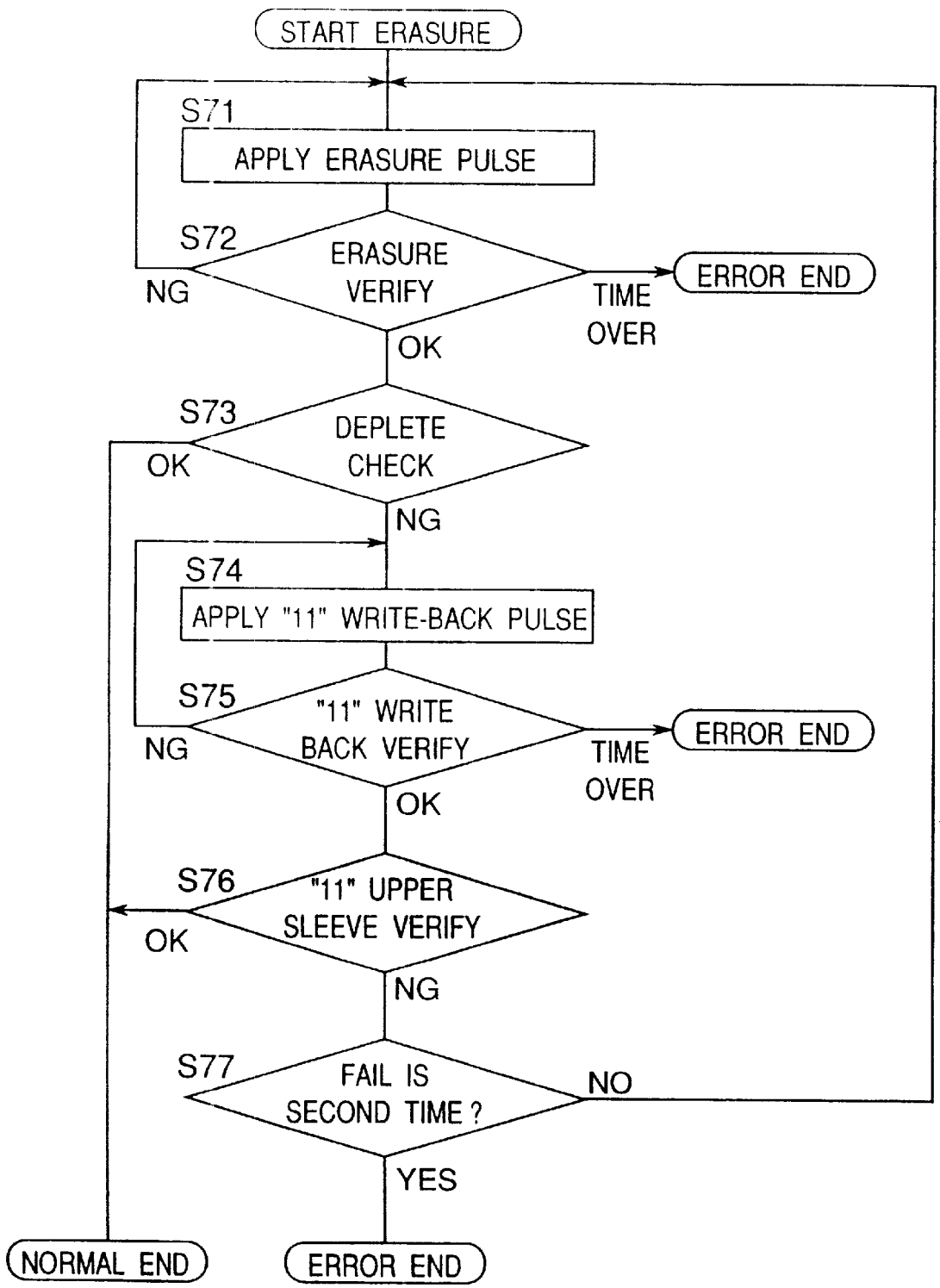
FIG. 17 is a flowchart with respect to the erasure operation in the conventional multiple-value flash memory.
Figure 18:
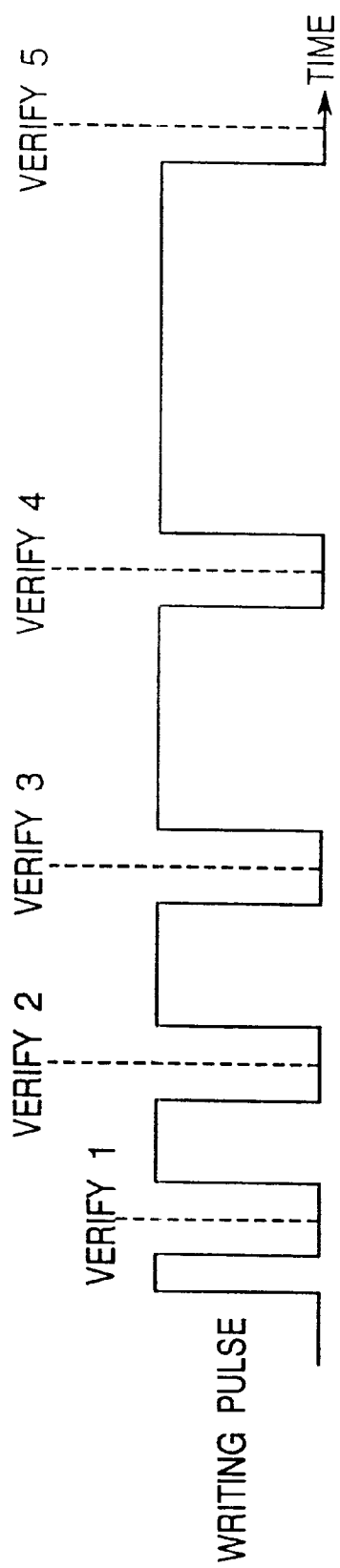
FIG. 18 is a view showing a writing pulse width set with respect to the writing operation of the conventional multiple-value flash memory.

FIG. 2 is a flowchart with respect to the writing operation in the multiple-value flash memory according to the first embodiment. Incidentally, in this multiple-value flash memory, in the same manner as shown in FIGS. 13 and 14, the threshold value voltage is regulated in accordance with each data added to the memory cell. When the writing operation starts, the data is input (S11). After the input of the data, the writing pulse (for example, 18V) is applied to the memory cell in which the state of "01" is to be written (S12). Then, along with the application of the writing pulse, the writing verify is executed at voltage VF3 (S13). In this writing verify, the data of the memory cell is read by applying the predetermined verify voltage to, for example, the word line voltage to compare this read data with the data to be written, thereby judging whether or not the data is normally written. Such a writing pulse application and writing verify are repeated in an interval until judgment is made that data is normally written. When the verify operation is passed with respect to all the memory cells until predetermined times (for example, ten times) are attained, the process subsequently proceeds to the application of the writing pulse of "00" (S14). However, with respect to the memory cells having the threshold value voltage of VF3 or more, the writing pulse is prevented from being applied any more. One the other hand, when the verify is not passed even when the predetermined times are attained, namely, in the case where there are memory cells in which the threshold voltage is not more than VF3V, the time is over and the error end is generated.

At steps S14, S15, S16 and S17, the writing pulse application and the writing verify are executed with respect to the state of "00" and "10" respectively in the same manner as the state of "01" described above. The writing pulse voltage and the predetermined times of the verify operation may be changed in the case of the writing pulse application of "01".

When the writing pulse application of "01", "00" and "10" and the writing verify are normally completed at steps 12 through 17, the upper sleeve verify operation in the state of "11", "10" and "00" is subsequently executed (S18 through S20). The upper sleeve verify is an operation of detecting the memory cell in which the threshold value voltage becomes too high. When the upper sleeve verify is passed with respect to all the "11", "10" and "00", the writing operation is normally completed. On the other hand, for example, in the case where the threshold value voltage of the memory cell which should be set to the state of "00" becomes VFU2 or more, the upper sleeve verify is identified as a "fail" and judgment is made as to whether or not the fail is the second time or not (S21). When the fail is the first time, the erasure operation is conducted (S22), and, furthermore, the condition of the second-time writing operation is changed (S23). At this time, as described in detail by referring to FIGS. 3 and 4, in the rewriting operation, the condition of the writing operation is changed so that the interval between the verify immediately after the start of the rewriting operation is narrowed as compared with the case of the first-time writing operation. After that, the writing operation same as the first-time operation is executed from S12 again.

FIGS. 3A and 3B are views showing time intervals (hereinafter referred to as a writing pulse width) of each of the writing pulse application in the first-time writing operation and a rewriting operation in the multiple-value flash memory, respectively. In the first embodiment, the initial value of the writing pulse width is set to 5 μs with respect to the first-time writing operation. On the other hand, with respect to the re-writing operation, the initial value is set to 2.5 μs which is a half of the initial value of the first-time writing operation. The writing pulse width used in the first-time writing operation and the rewriting operation increases so that the width has twice larger than the value of the width of the writing pulse by one value after the initial value.

In this manner, by using a short width as compared with the first-time writing operation as the initial value of the writing pulse width in the rewriting operation, the verify interval immediately after the start of the rewriting operation can be narrowed. As a result, as explained by referring to FIG. 4, it becomes possible to suppress the writing failure in the rewriting operation.

Figures 4A, 4B:
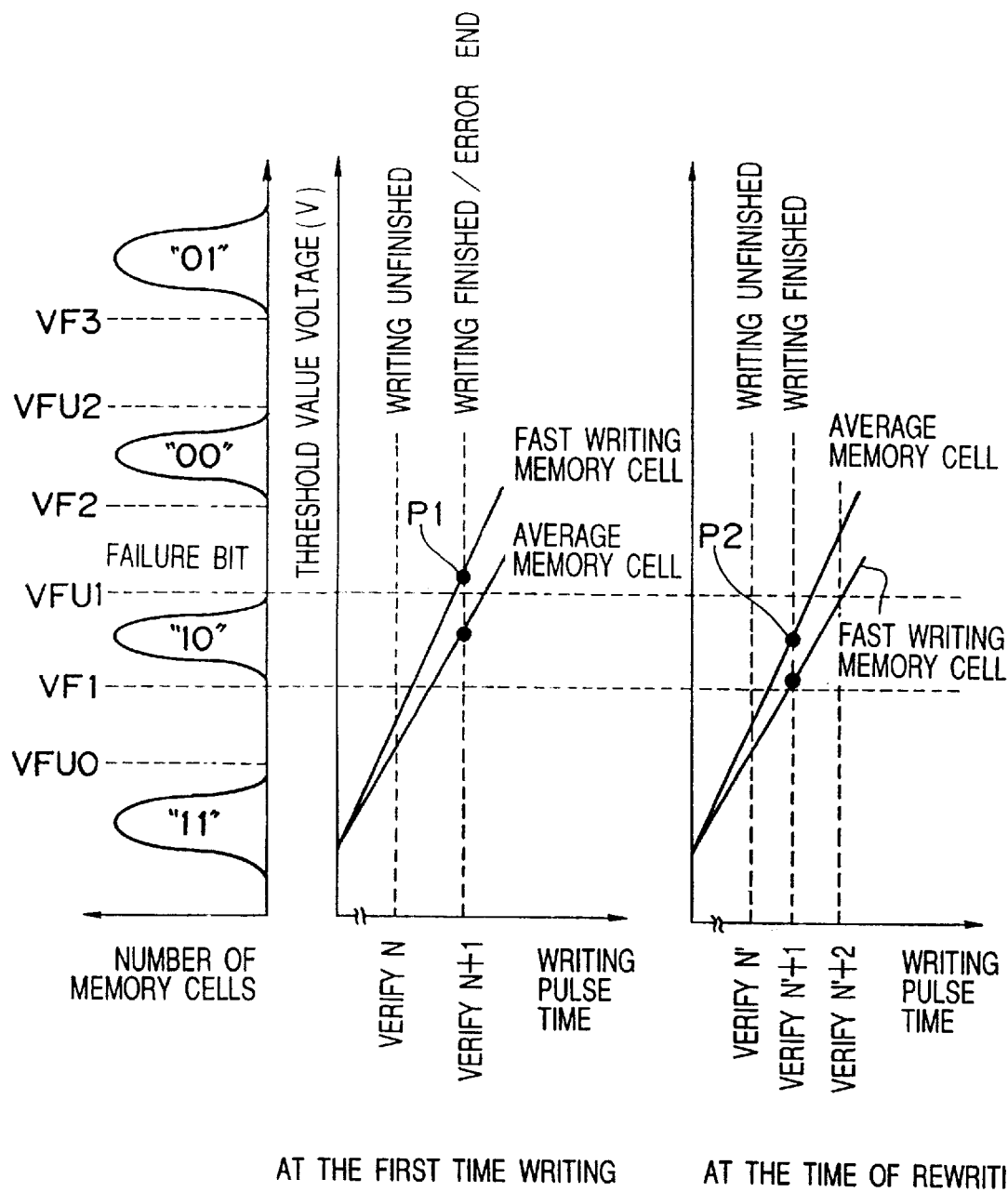
FIGS. 4A and 4B are views showing a relation between the writing pulse time and the threshold value voltage of the memory cell in the writing operation of the multiple-value flash memory.

FIG. 4 is a view showing a relation between a writing pulse time and the preset threshold value voltage of the memory cell in the writing operation of the multiple-value flash memory according to the first embodiment. FIGS. 4A and 4B are views showing the case of the first-time writing operation and the rewriting operation. As an example, there is considered a case in which a memory cell which executes a fast writing operation is present in the memory cell in which the stage of "10" should be written.

As shown in FIG. 4A, in the verify N after applying the writing pulse N times, the threshold value voltage is set to VF1 or less. As a result, the writing operation remains unfinished. When verify (N+1) is conducted after the application of the writing pulse again, the threshold value voltage becomes higher than VFU1, with respect to the memory cell in which a fast writing operation is executed as denoted by point P1. That is, the fail is generated in the upper sleeve of "10", so that error end is generated. In this case, the rewriting operation is subsequently executed after an erasure operation is executed. As described above, in the rewriting operation, the short width as compared with the first-time writing operation is used as the initial value of the writing pulse width, so that the verify is executed in a minute manner immediately after the start of the writing operation (refer to FIG. 4B) As a result, the threshold value voltage which has become an error end is restricted to the scope of the predetermined threshold value voltage set in advance, and is passed at the verify (N+1) as denoted by point P2.

In this manner, the initial value of the writing pulse width in the rewriting operation is set to a smaller level than the first-time writing operation, so that the verify is executed in a minute manner immediately after the start of the rewriting operation with the result that the writing failure can be suppressed in the rewriting operation. Furthermore, the first-time writing verify is roughly set, and the second-time writing verify is set to be more precise than the first time write verify, so that the average writing speed can be further raised while securing the same rate of writing failure.

Incidentally, in the first embodiment described above, the initial value of the writing pulse width in the rewriting operation is set to be shorter than the case of the first-time writing operation. At the same time, after the initial value, each value of the writing pulses width is set to be twice as large as the value of the pulse width of the previous writing by one cycle. The writing pulse is not restricted thereto. As long as the writing verify is set to be more fine immediately after the rewriting operation, any setting can be applied. For example, as shown in FIGS. 5A and 5B, each of the writing pulses width in the first-time writing operation is set to have twice as large as the previous value of the writing pulse width by one cycle. However, the writing pulse width in the rewriting operation may be set to 1.5 times as large as the writing pulse width in the previous writing by one cycle after the initial value. Furthermore, as shown in FIGS. 6A and 6B, the writing pulse width in the first-time writing operation is set to be uniformly twice as large as the writing pulse width of the previous writing by one cycle respectively. On the other hand, the writing pulse width in the rewriting operation is set to be equal with respect to the predetermined number (four in this example) of writing pulses after the start of the rewriting operation. With respect to the foregoing writing pulses, the writing pulse width may be set to be twice as large as the pulse width of the previous writing by one cycle respectively.

As shown in these FIGS. 5A, 5B 6A and 6B, it is possible to suppress the writing failure ratio in the rewriting operation in the same manner as the case of the first embodiment even in the case where the writing pulse width is set. Furthermore, the average writing speed can be further raised while maintaining the writing failure ratio on the same level as has been the case by roughly setting the first-time writing verify and setting the second-time writing verify in a more fine manner than the first-time writing verify.

Another embodiment of the present invention will be explained hereinafter.

Second Embodiment

Figures 7A, 7B:
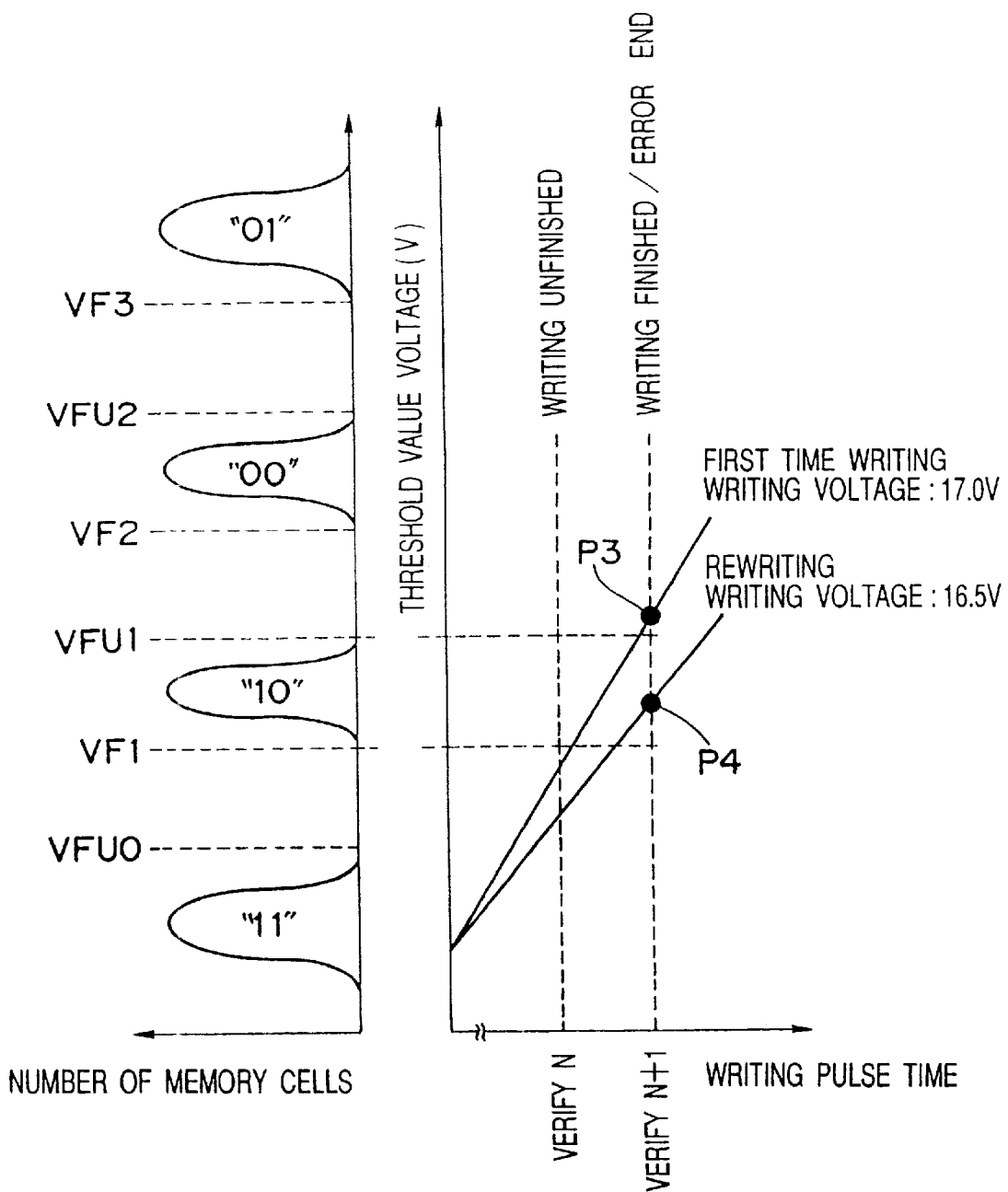
FIGS. 7A and 7B are views showing a relation between the writing pulse time in the writing operation of the multiple-value flash memory and a preset threshold value voltage of the memory cell according to a second embodiment of the present invention.

FIGS. 7A and 7B are views showing a relation between the writing pulse time and the preset threshold value voltage of the memory cell in the writing operation of the multiple-value flash memory according to the second embodiment of the present invention. In the second embodiment, the voltage value of the writing pulse applied to the word lines is changed in the first-time writing operation and the rewriting operation. Such change in the writing condition will be explained in the case where the application of the "10" writing pulse fails in the first time writing operation. Suppose that in the first-time writing operation, the voltage (hereinafter referred to as writing voltage) is set to 17.0V and this fails at the verify (N+1) as denoted by point P3. In order to settle this fail, this writing voltage is set to 16.5V in the rewriting operation. Then, in the rewriting operation, a voltage is used which is lower than the first-time writing voltage.

As a consequence, since the change in the threshold value voltage of the memory cell becomes small even if the writing pulse width is the same, the threshold value voltage which ends in error in the first-time writing operation is restricted within the scope of the predetermined threshold value at verify (N+1) and is passed. As a consequence, the writing failure ratio can be suppressed in the rewriting operation. Furthermore, the average writing speed can be further raised while maintaining the writing failure ratio on the same level as has been the case by setting to a high level the voltage value of the first time writing pulse and lowering the second time writing pulse than the first time writing voltage.

Third Embodiment

Figures 8A, 8B:
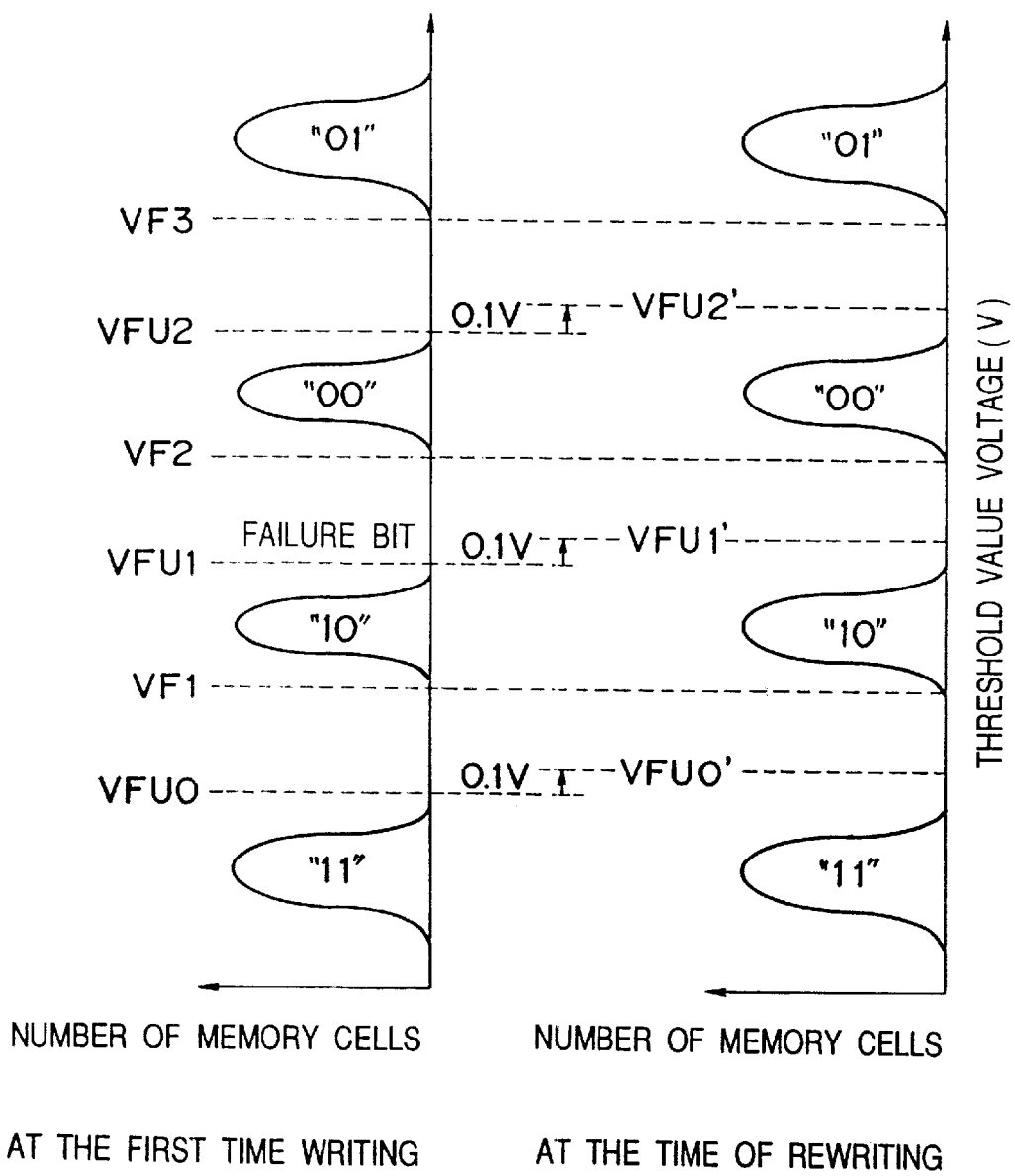
FIGS. 8A and 8B are views showing a threshold value voltage of the memory cell set with respect to the first-time writing operation and a rewriting operation of the multiple-value flash memory according to a third embodiment of the present invention.

FIGS. 8A and 8B are views showing a threshold value voltage of a memory cell which is set with respect to the first time writing operation and the rewriting operation of the multiple-value flash memory according to the third embodiment of the present invention. In the third embodiment, the upper sleeve verify voltage in the rewriting operation (namely, the voltage level which forms an upper limit of the reference scope of the threshold value voltage set in the memory cell) is set to a level higher than the first time writing operation. In the first-time writing operation, the upper sleeve verify voltage VFU0 of the "11" is set to 1.7V, the upper sleeve verify voltage VFU1 of "10" is set to 2.7V, and the upper sleeve verify voltage VFU2 of "00" is set to 3.7V. On the other hand, in the rewriting operation, as the upper sleeve verify voltage level, voltage levels VFU0' through VFU2' which are obtained by raising the voltage levels VFU0 through VFU2 by 0.1V respectively are used. As a consequence, the scope of the threshold value voltage scope of the tolerated memory cell is widened. As a consequence, in the rewriting operation, the writing failure ratio can be suppressed.

Incidentally, in this case, a voltage difference in the threshold value voltage between the "10" state and "00" state is secured to 0.6V in the firs t time writing operation while in the rewriting operation, the difference is only 0.5V. Thus, it is known that the data reliability is deteriorated as compared with the case in which the difference is secured to 0.6V. However, when the fail possibility is generally sufficiently small (for example, $10^{-5}$) in the first-time writing operation, this becomes virtually no problem at all.

With respect to this method, FIGS. 9A and 9B are views showing a threshold value voltage of the memory cell set in the first-time writing operation and in the rewriting operation according to a variation of the third embodiment. In this variation example, the voltage level of the writing verify (namely, the voltage level which forms a lower limit of the reference scope of the threshold value voltage set in the memory cell) is set to a level lower than that of the first time writing operation. As can be seen from FIG. 9, as the e writing verify voltage level in the rewriting operation, the voltage levels VF1' through VF2' are used which are formed by lowering by 0.1V the writing verify voltage levels VF1 through VF2 in the first time writing operation. Consequently, in the same manner as the case of the form of the third embodiment, the threshold voltage scope of the tolerated memory cell is widened. As a consequence, the writing failure ratio can be suppressed in the rewriting operation.

Fourth Embodiment

Figures 10A, 10B:
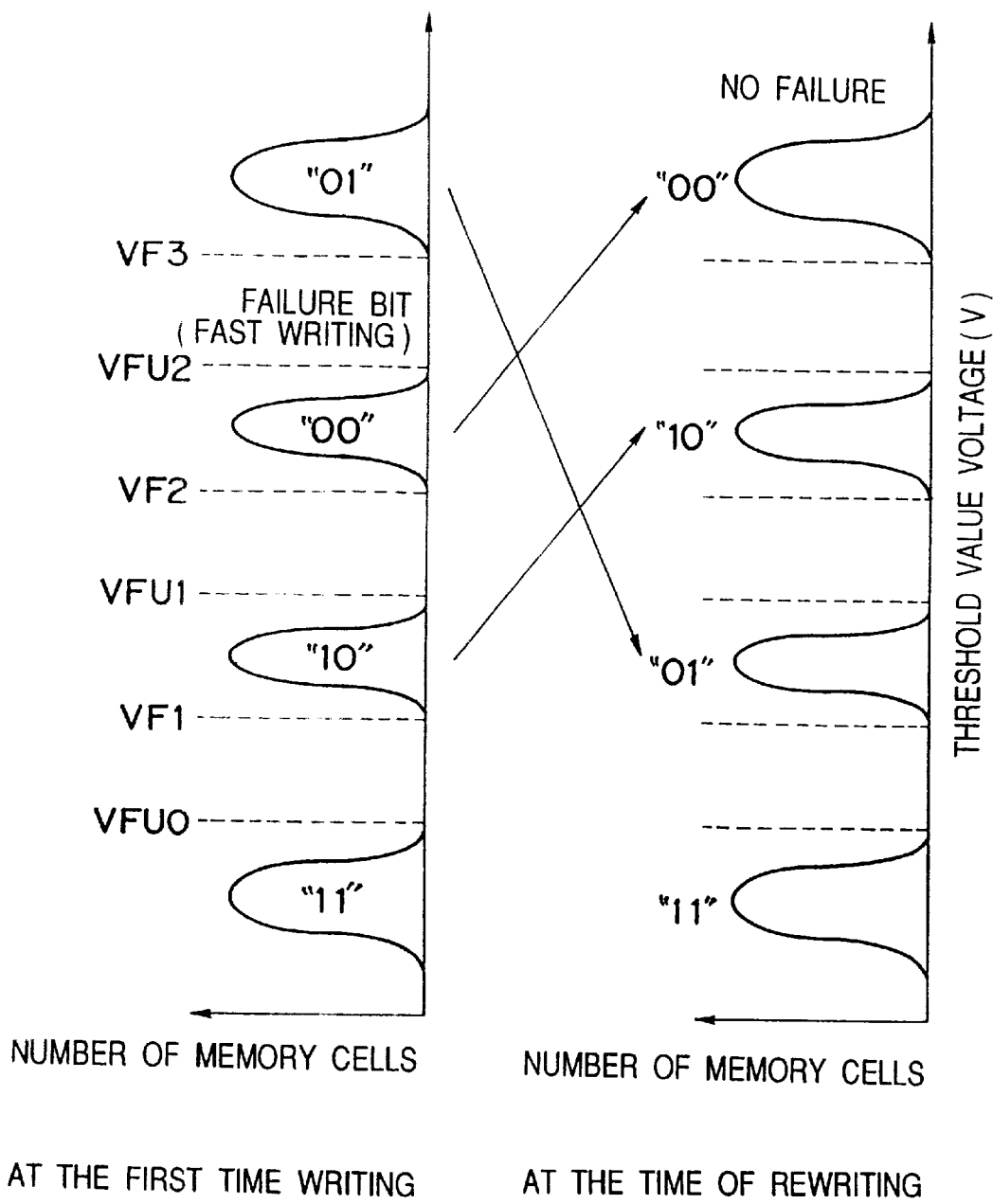
FIGS. 10A and 10B are views showing a threshold value voltage of a memory cell set with respect to the first-time writing operation and the rewriting operation according to a fourth embodiment of the present invention.

FIGS. 10A and 10B are views showing a threshold value voltage of the memory cell set in the first time writing operation and in the rewriting operation according to the fourth embodiment of the present invention. In the fourth embodiment, in the case where fail is generated in the first time writing operation, the rewriting operation is executed after the corresponding relation between the data to be written on the memory cell and the threshold value voltage is executed. As shown in FIGS. 10A and 10B, the writing operation is executed corresponding to "11", "10", "00" and "01" in order from the low threshold value of the memory cell in the first-time writing operation. In this case, it is thought that memory cell is present which executes a fast writing operation so that the fail is generated at the upper sleeve verify of "00".

In the first-time writing operation, in order to solve the fail which is generated in the upper sleeve verify of "00", the threshold value voltage of the memory cell is changed in order to allow the threshold value voltage to correspond to "11", "01", "10" and "00". As a consequence, the memory cell which fails is such that the highest state of the threshold value voltage is written. When the threshold value voltage is on the highest writing level, no problem is generated even at too high the threshold value voltage so that no fail is generated because no upper sleeve verify is conducted.

In the fourth embodiment, as described above, after the corresponding relation between the threshold value voltage of memory cell and the data is changed at the time of writing data with respect to the multiple-value flash memory, the following structure may be adopted so that data can be normally read. For example, with respect to one word line, four memory cells are provided which have the same structure as a normal memory cell as separate entity from the normal cell. An access to these four memory cells (hereinafter, represented as EMC (1), EMC (2), EMC (3) and EMC (4)) from the outside is disabled. At the time of writing data, data such as "01", "00", "10", "11" is input to the EMC (1) through EMC (4) respectively with the operation of the inside of the memory.

In this structure, in the case where the corresponding relation between the threshold value voltage of memory cell and the data is not changed at the time of writing the data, "01", "00", "10" and "11" of EMC (1) through EMC (4) are read at the time of reading the data from the word line to be compared with the data written in the normal memory cells. In this case, the data written in the normal cells is the same as the data input in the EMC (1) through EMC (4) and is output to the outside as it is.

Furthermore, on the other hand, when the corresponding relation between the threshold value voltage of the memory cell and the data is changed, "01", "00", "10" and "11" input into the EMC (1) through EMC (4) at the time of reading data from the word line to be compared with the data written in the normal memory cells. In this case, it is recognized that the corresponding relation of "01" and "00" is changed inside of the memory at the time of writing so that data "01" and "00" written on the normal cells are replaced to be output to the outside.

In this manner, apart from normal memory cells, it is possible that data can be read normally at the time of reading data even when the corresponding relation between the threshold value voltage of the memory cell and the data is changed in any way by providing a memory cell in which a definite voltage value is constantly input.

Figure 11A:
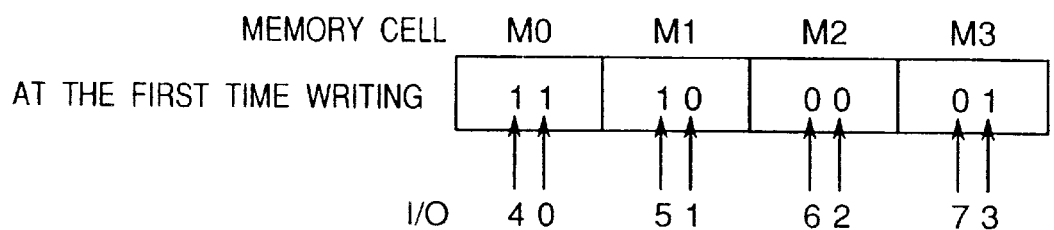
FIGS. 11A and 11B are views showing an example in which the corresponding relation between the memory cell in which data is to be written and the Y address is changed between the first-time writing operation and the rewriting operation.
Figure 11B:
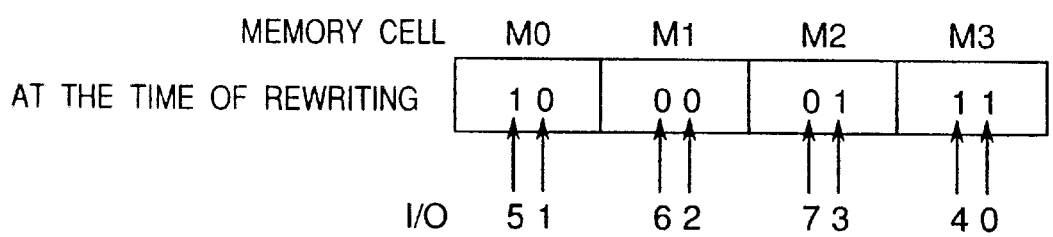

FIGS. 11A and 11B are views showing an example in which the corresponding relation between the memory cell in which data should be written and the Y address (data I/O) is changed between the first-time writing operation and the rewriting operation. In the first-time writing operation, the lower place bits and the upper place bits of M0 are allowed to correspond to I/O=0,4 with respect to four memory cells M0, M1, M2, and M3 while the lower place bits and the upper place bits of M1 are allowed to correspond to I/O=1,5 while the lower place bits and the upper place bits of M2 are allowed to correspond to I/O=2, 6. Further the lower place bits and the upper place bits of M3 are allowed to correspond to I/O=3, 7. At this time, when the data "0" and "0" are input as writing data, the threshold value voltage of the memory cell M2 is written in the state of "00". In the case where the rewriting is executed after the generation of fail in the writing of "00", the relation between the memory cell and the I/O is changed.

At the time of this change, for example, M1 is allowed to correspond to I/O=2, 6 and M2 is allowed to correspond to I/O=3, 7, so that the data different from the case of the first time writing operation can be written. Such method is effective in suppressing the writing failure rate in the case where the possibility is relatively high that the memory cells become fail in the first-time writing fail at the time of rewriting.

Fifth Embodiment

Figure 12:
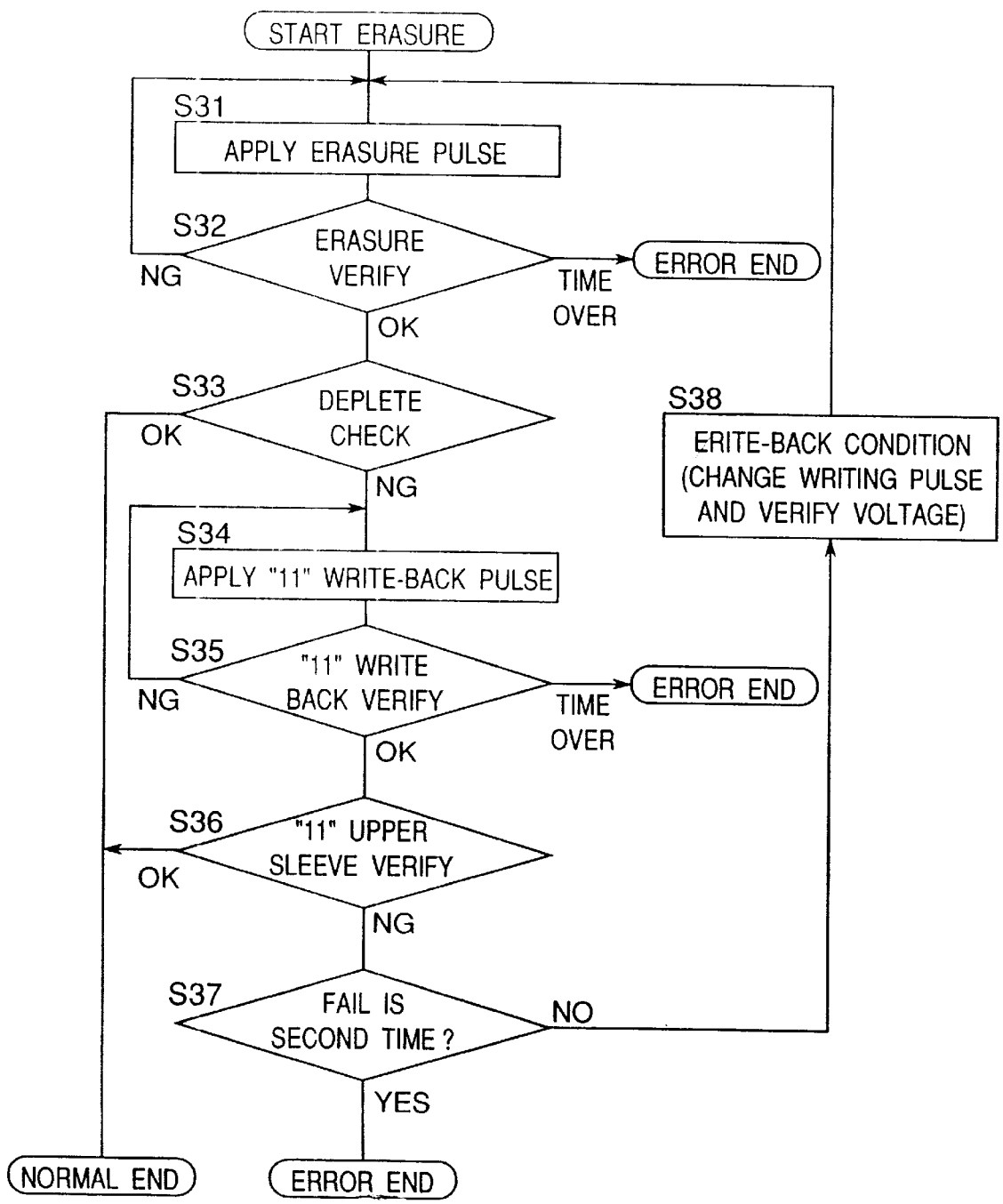
FIG. 12 is a flowchart with respect to an erasure operation in the multiple-value flash memory according to a fifth embodiment of the present invention.

In the first to fourth embodiments described above, an attempt is made to improve a writing speed and suppress a writing failure rate at the time of writing operation. As shown in FIG. 12, it is possible to suppress the erasure failure rate at the time of re-erasure operation by changing the writing back condition between the first time erasure operation and re-erasure operation. FIG. 12 is a flowchart showing an erasure operation according to the fifth embodiment of the present invention. When the erasure operation starts, an erasing pulse which is a negative high voltage is applied in the beginning (S31). Along with the application of this erasure pulse, the erasure verify is executed for judging whether or not the threshold voltage of the memory cell becomes the predetermined verify voltage or less (S32). The erasure pulse application and the erasure verify are repeated in an interval until judgment is made that the erasure of data has been normally executed. A verify operation is passed with respect to all the memory cells until the predetermined times are attained (for example, ten times), the process proceeds to the deplete check (S33). On the other hand, in the case where the erasure verify is not passed even when the predetermined times are attained, time is over when the memory cell is present which has a threshold value voltage of no less than VER, so that error end is generated.

In the deplete check of S33 judgment is made as to whether there is any memory cell having a threshold value voltage which has become too low. When the deplete check is passed, the erasure operation is normally ended. In the case where judgment is made that NG is given in the deplete check, the write-back pulse of "11" is applied so that the threshold value voltage becomes the predetermined value or more (S34). Along with the application of this write-back pulse, the write-back verify is executed for judging whether or not the threshold value voltage of all the memory cells becomes the predetermined value or more (S35). When the write back verify is passed, the upper sleeve verify of "11" is subsequently executed (S36), and the memory cell is detected which has a threshold value voltage of VFU0 or more. In the case where judgment is made that the upper sleeve verify of "11" is OK, the verify is normally ended. On the other hand, in the case where the judgment is made that the upper sleeve verify of "11" fails, judgment is made as to whether or not the fail is the second time (S37). In the case where the fail is the first time, the write-back conditions such as write-back pulse, the verify voltage and the like are changed (S38). In addition, the erasure operation same as the first time is executed again from S31.

Along with the application of the write back pulse of "11" in the erasure operation, the probability is very small that the upper sleeve verify of "11" fails. On top of that, the erasure failure rate can be suppressed when the probability of fail at the second time is lowered by using the methods explained in the first to third embodiments are used in the re-erasure operation. Besides, along with the suppression of the erasure failure rate, the average erasure speed can be raised.

Incidentally, the present invention is not restricted to embodiments which have been illustrated. It goes without saying that various modifications and change in the design can be made within the scope of not departing from the gist of the present invention.

What is claimed is:

1. A non-volatile semiconductor device having a memory cell in which a threshold value voltage changes and the data corresponding to the threshold value voltage are written in response to application of the writing pulse having a predetermined width and voltage to word lines and bit lines, the device executing a verify operation for judging the data from the threshold value voltage every application of the writing pulse in the data writing operation, characterized in that:

a rewriting condition is changed to a predetermined condition different from a first-time writing condition for suppressing the writing failure rate when the writing failure is generated in the first-time writing operation and the writing operation is re-executed.

2. The non-volatile semiconductor device according to claim 1, wherein the initial value of the writing pulse width is set to a level smaller than the value at the first-time writing operation when the writing operation is re-executed.

3. The non-volatile semiconductor device according to claim 1, wherein an increase rate of the writing pulse width is set to a smaller level than the first-time writing operation when the writing operation is re-executed.

4. The non-volatile semiconductor device according to claim 1, wherein the writing pulse width is set to an equal width with respect to a predetermined number of writing pulses after the start of the writing pulse when the writing operation is re-executed.

5. The non-volatile semiconductor device according to claim 1, the writing pulse voltage is set to a smaller level than the first-time writing operation when the writing operation is re-executed.

6. The non-volatile semiconductor device according to claim 1, wherein the reference scope of the threshold value used at the time of the verify is set to a level higher than that of the first-time writing operation when the writing operation is re-executed.

7. The non-volatile semiconductor device according to claim 6, wherein a voltage level which forms an upper limit of the reference scope of the threshold value voltage is set to a level higher than that of the first-time writing operation.

8. The non-volatile semiconductor device according to claim 6, wherein a voltage level which forms a lower limit of the reference scope of the threshold value voltage is set to a level lower than that of the first-time writing operation.

9. The non-volatile semiconductor memory device according to claim 1, wherein the corresponding relation between the data to be written and the threshold value voltage of the memory cell is changed when the writing operation is re-executed.

10. The non-volatile semiconductor memory device according to claim 1, wherein the corresponding relation between a memory cell in which data is written and the Y-address of the data is changed when the writing operation is re-executed.

11. The non-volatile semiconductor memory device according to claim 1, wherein the non-volatile semiconductor device is constituted in such a manner that a write back pulse having a predetermined width and voltage is applied to set the threshold value voltage to a predetermined value or more in the case where the threshold value voltage of the memory cell becomes less than the predetermined value voltage in the data erasure operation, and wherein the writing condition is set which is capable of suppressing the write-back failure rate than the case of the first time erasure operation in the same manner that the writing condition can suppress the write failure rate than the first time writing operation, when the write-back failure is generated in the first time data erasure operation and the erasure operation is re-executed.

* * * * *